United States Patent
Jaussaud et al.

(10) Patent No.: US 7,208,392 B1
(45) Date of Patent: Apr. 24, 2007

(54) CREATION OF AN ELECTRICALLY CONDUCTING BONDING BETWEEN TWO SEMI-CONDUCTOR ELEMENTS

(75) Inventors: Claude Jaussaud, Meylan (FR); Eric Jalaguier, Duriage (FR); Roland Madar, Eybent (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 10/069,517

(22) PCT Filed: Sep. 7, 2000

(86) PCT No.: PCT/FR00/02468

§ 371 (c)(1),
(2), (4) Date: Mar. 5, 2002

(87) PCT Pub. No.: WO01/18853

PCT Pub. Date: Mar. 15, 2001

(30) Foreign Application Priority Data

Sep. 8, 1999 (FR) .................................. 99 11224

(51) Int. Cl.
   *H01L 21/30* (2006.01)
(52) U.S. Cl. .................. 438/455; 438/459; 438/652; 257/E21.607
(58) Field of Classification Search ............... 438/406, 438/455, 459, 652, 655, 682, 683, 768, 931, 438/464; 257/750, 754, E21.607
See application file for complete search history.

(56) References Cited

U.S. PATENT DOCUMENTS

| | | | | |
|---|---|---|---|---|
| 4,826,787 A | * | 5/1989 | Muto et al. ................. | 228/193 |
| 5,349,207 A | * | 9/1994 | Malhi ........................... | 257/76 |
| 5,374,564 A | * | 12/1994 | Bruel ........................... | 438/455 |
| 5,387,555 A | * | 2/1995 | Linn et al. ................... | 438/455 |
| 5,441,911 A | | 8/1995 | Malhi | |
| 5,877,070 A | * | 3/1999 | Goesele et al. ............. | 438/458 |
| 5,973,257 A | * | 10/1999 | Cantarini et al. ........... | 136/249 |
| 6,118,181 A | * | 9/2000 | Merchant et al. ........... | 257/757 |
| 6,251,754 B1 | * | 6/2001 | Ohshima et al. ............ | 438/506 |
| 6,255,731 B1 | * | 7/2001 | Ohmi et al. ................. | 257/758 |
| 6,423,614 B1 | * | 7/2002 | Doyle ......................... | 438/458 |

FOREIGN PATENT DOCUMENTS

EP   0 587 996   3/1994

OTHER PUBLICATIONS

Yallup et al. "Buried Wsix SOI structures", Oct. 1995, IEEE, pp. 137-138.*
Goh et al. "Buried metallic layers in silicon using wafer fusion bonding techniques", Jun. 1994, IEEE, pp. 625-628.*

(Continued)

*Primary Examiner*—Kevn M. Picardat
(74) *Attorney, Agent, or Firm*—Oblon, Spivak, McClelland, Maier & Neustadt, P.C.

(57) ABSTRACT

A method of creating an electrically conducting bonding between a face of a first semiconductor element and a face of a second semiconductor element using heat treatment. The method applies the faces one against the other with the placing between them of at least one layer of a material configured to provide, after heat treatment, an electrically conducting bonding between the two faces. The deposited layers are chosen so that the heat treatment does not induce any reaction product between said material and the semiconductor elements. Then, a heat treatment is carried out.

9 Claims, 3 Drawing Sheets

OTHER PUBLICATIONS

Yallup et al. "Buried Wsix SOI Structures", Oct. 1995, IEEE, pp. 137-138.*

Goh et al. "Buried metallic Layers In silicon using wafer fusion bonding techniques", Jun. 1994, IEEE, pp. 625-628.*

C.L. Shieh et al.: "A 1.3 mu m InGaAsP ridge waveguide laser on GaAs and silicon substrates by thin-film transfer" Third International Conference on Indium Phosphide and Related Materials, Cardiff, UK, pp. 272-275 Apr. 8, 1991-Apr. 11, 1991.

Y. Lu et al.: "Eutectic bonding for inducing in-plane strain in GaAs and GaAs-AlGaAs MQW thin films" Advanced Metallization for Devices and Circuits—Science, Technology, and Manufacturability Symposium, pp. 607-612 Apr. 4, 1994-Apr. 8, 1994.

R.F. Wolffenbuttel: "Low-temperature intermediate Au-Si wafer bonding: eutectic or silicide bond" Sensors and Actuators A (Physical), vol. A62, No. 1-3, pp. 680-686 Jul. 1997.

* cited by examiner

CREATION OF AN ELECTRICALLY CONDUCTING BONDING BETWEEN TWO SEMI-CONDUCTOR ELEMENTS

TECHNICAL FIELD

This invention relates to a method that permits the creation of an electrically conducting bonding between two semi-conductor elements.

STATE OF THE PRIOR ART

The transfer of a thin film of semi-conductor material onto a support is often used in the field of micro-electronics. This is the case particularly for devices produced on GaAs for which it is preferable to lay a substrate made up of a thin film of GaAs on a silicon support. This solution offers several advantages. It enables one to reduce the costs since GaAs is an expensive material in relation to silicon. It enables one to simplify handling since GaAs is fragile and therefore must be handled delicately. It also enables one to reduce the weight of the components, which is an important parameter for space applications, since silicon is lighter than GaAs.

Such a transfer is made traditionally by bonding using an oxide, this type of bonding being easy to control. However, bonding using an oxide has the particular feature that the thin film is electrically insulated from its support. Hence, for certain applications it is necessary to establish vertical electrical conduction through the substrate. This is the case particularly for diodes produced on a film of SiC formed on a silicon support and for solar cells produced by deposition of GaAs on silicon.

Furthermore, certain types of transistors (for example, transistors with a permeable base or a metal base) necessitate having a metal layer buried under the layer of semi-conductor from which they are produced. This type of layer is difficult to create and conductive bonding is the most simple way of producing this type of structure.

Several solutions have been proposed for creating conducting bonding of two plates of silicon. One may mention the article "Buried Cobalt Silicide Layers in Silicon Created by Wafer Bonding" by K. LJUNGBERG et al., that appeared in J. Electrochem. Soc., Vol. 141, No. 10, October 1994, pages 2829–2833 and the article "Low Temperature Silicon Wafer to Wafer Bonding with Nickel Silicide" by Zhi Xiong Xiao et al., that appeared in J. Electrochem. Soc., Vol. 145, No. 4, April 1998, pages 1360–1362. All these solutions consist of forming a silicide from a metal deposited on the faces of the plates to be bonded, by reaction of the metal and the semi-conductor material. These solutions have two disadvantages. On the one hand, the formation of the silicide consumes a part of the semi-conductor film which may be a disadvantage in the case of very thin films. On the other hand, there is diffusion of the metal into the semi-conductor, which has the consequence of degrading its properties. This is particularly the case if nickel is used. Furthermore, the compounds formed are not stable at high temperature which restricts the possibilities for heat treatment after creation of the bonding. These two things can be very important, if one wishes, after bonding to carry out an epitaxy which can involve the use of high temperatures (of the order of 1600° C. in the case of SiC).

DESCRIPTION OF THE INVENTION

So as to remedy the disadvantages mentioned above, according to this invention, it is proposed to use a bonding that uses one or more layers that do not react with at least one of the two semi-conductor materials to be electrically connected.

Therefore the subject of the invention is a method for creating an electrically conducting bonding between a face of a first semi-conductor element and a face of a second semi-conductor element by means of heat treatment, consisting of:

depositing at least one layer of material on said face of the first semi-conductor element and at least one layer of material on said face of the second semi-conductor element, these deposited layers combining during said heat treatment to form a layer that provides an electrically conducting bonding between the two faces, applying said faces one against the other, with interposing of said layers of deposited material between them, carrying out said heat treatment, characterized in that the layer of material deposited onto said face of the first semi-conductor element and the layer of material deposited onto said face of the second semi-conductor element are chosen in order to react in the solid phase during the heat treatment and to form a temperature stable mixture with respect to the first and the second semi-conductor element, the heat treatment not inducing any reaction product between the deposited materials and at least one of the semi-conductor elements.

According to one particular embodiment, the material of the layer deposited on the face of the first semi-conductor element is distinct from the material of the layer deposited on the face of the second semi-conductor element, the heat treatment forming a mixture that does not induce any reaction product with the first and the second semi-conductor.

According to another particular embodiment, one of the layers of material is deposited with an excess thickness such that a part of this layer, in contact with the other layer of material combines with the other deposited layer of material in order to form said stable mixture, the other part of the layer deposited with an excess thickness, in contact with the semi-conductor element on which it is deposited, reacting during the heat treatment with this semi-conductor element in order to form a film with ohmic contact.

A layer of oxide may be provided between the deposited layers of material, the oxide being chosen in order to react with at least one material of said deposited layers, the thicknesses of the oxide layer and the layer of material with which the oxide reacts being such that the oxide formed is in the form of isolated precipitates which do not substantially harm the electrically conducting bonding. This layer of oxide may be deposited on one of the layers of material or on both of them, for example, by a method chosen from among vacuum deposition and sol-gel type deposition.

In order to improve the bonding, the first and second semi-conductor elements can be pressed one against the other during the heat treatment.

The electrically conducting bonding may result from a mixture of identical materials. By way of an example, the first semi-conductor element is SiC and the second semi-conductor element is SiC, the intermediate layers comprising a layer of tungsten and a layer of silicon on said face of the first semi-conductor element and a layer of tungsten and a layer of silicon on said face of the second semi-conductor element, the mixture formed after the heat treatment comprising $WSi_2$.

If one of the semi-conductor elements is a thin film, the method may comprise a preliminary step consisting of defining this thin film as a superficial layer of a substrate, intended to be separated from the rest of the substrate. According to a first embodiment example, during the preliminary step, the substrate is formed by stacking a support, a sacrificial layer and the thin film, the separation of the thin film from the rest of the substrate being obtained, after creation of the bonding, by dissolution of the sacrificial layer. According to a second embodiment example, during the preliminary step, the thin film is bounded in a substrate by a layer of micro-cavities obtained by ionic implantation, the separation of the thin film from the rest of the substrate being consecutive to the bonding heat treatment or to a specific heat treatment or to the application of mechanical forces or to the combination of a heat treatment and the application of mechanical forces.

BRIEF DESCRIPTION OF THE DRAWINGS

The invention will be better understood and other advantages and particular features will become apparent on reading the description that follows, given by way of a non-limitative example and accompanied by the appended drawings among which.

DETAILED DESCRIPTION OF EMBODIMENTS OF THE INVENTION

The invention proposes the creation of a bonding using layers which do not react with one or the other of the semi-conductor elements to be electrically connected.

According to the invention, the materials interposed between the two elements to be bonded react during the heat treatment to form a mixture stable with respect to these elements at high temperatures and notably temperatures greater than that of the heat treatment. This stability at high temperature is particularly important when the elements are made of SiC and one of them must be subjected to epitaxy.

The method according to the invention does not require the use of a diffusion barrier although a diffusion barrier may be used.

Preferably, the interposed materials are

W (or a compound based on W)/Si

W (or a compound based on W)/Si/W (or a compound based on W).

The thicknesses of the interposed layers are generally dimensioned so that all of the materials in these layers interact to form a new stable material. However, in certain cases, it may be advantageous to use at least one layer of material having an excess thickness. This excess thickness of material then reacts during the high temperature heat treatment with the element with which it is in contact in order to form a film with ohmic contact.

By way of example, for elements to be bonded made of SiC and interposed layers made of W and Si, in order for all of the interposed layers to react, the ratio of the total thickness of the Si layer or layers to the total thickness of the W layer or layers must be equal to or close to 2.5 in order to obtain a homogeneous layer of $WSi_2$. In order to have an excess thickness capable of reacting, it must be slightly below 2.5. This enables one to have a thin film based on WSi and WC which is also stable at high temperature.

According to a kinetic approach, layers are used which are only thermodynamically stable with one or the other of the semi-conductor materials at the temperatures used during production of the devices and during their use, after the heat treatment for bonding the two semi-conductor elements. For example, in the case of the transfer of silicon carbide onto silicon carbide, the following stacks can be used SiC element/W layer/Si layer-Si layer/W layer/SiC, the silicon being amorphous or crystalline. During the heat treatment, the tungsten reacts with the silicon to form $WSi_2$. For a structure SiC/W (thickness 0.1 μm)/Si (thickness 0.25 μm)–Si(thickness 0.25 μm)/W (thickness 0.1 μm)/SiC, SiC/$WSi_2$/SiC is obtained. Reaction occurs from 650° C., implying reaction of the silicon with the tungsten, without the thin film of SiC being consumed and the system is stable at more than 1600° C.

Figure 1A:
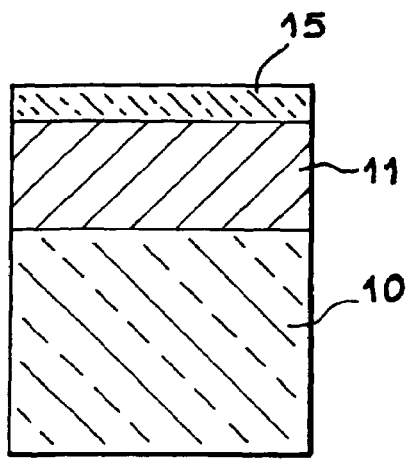
FIGS. 1A to 1D illustrate a first example of the creation of an electrically conducting bonding between two semi-conductor elements, according to the method of the invention.
Figure 1B:
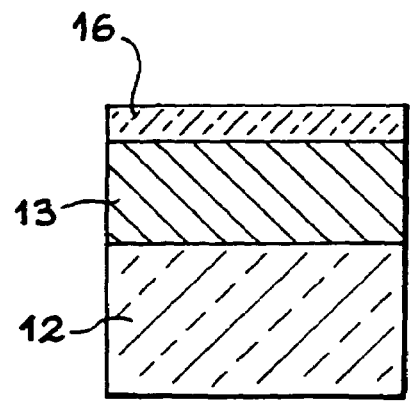
Figure 1C:
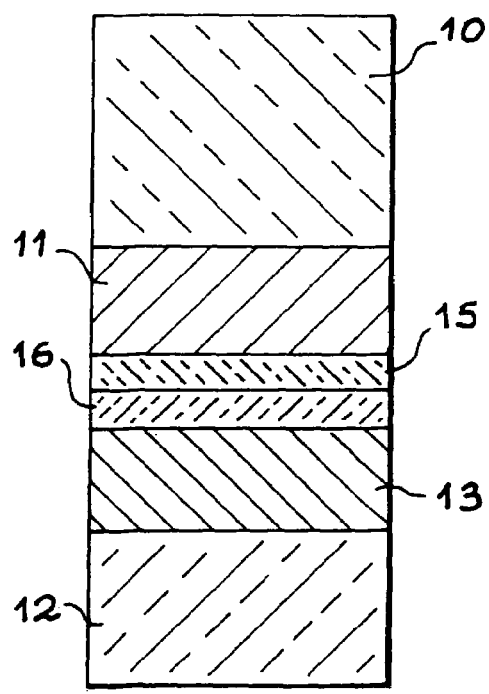
Figure 1D:
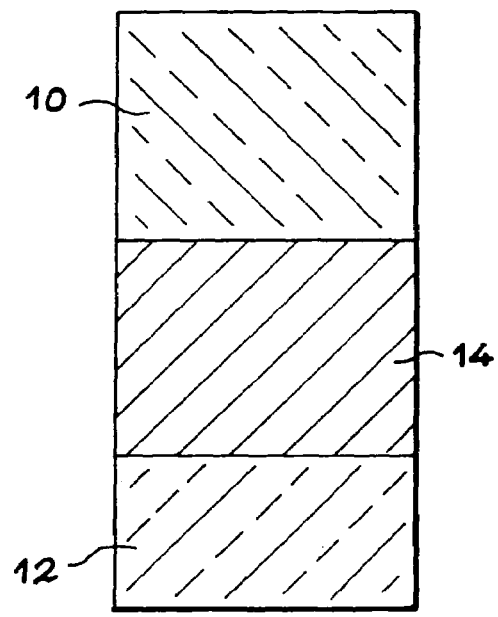

FIGS. 1A to 1D are transverse views which illustrate a first embodiment example of the method according to the invention for which the bonding is carried out in accordance with a kinetic approach. FIG. 1A shows a SiC plate 10 covered successively with a layer 11 of tungsten and a layer 15 of silicon. FIG. 1B shows a SiC plate 12 covered successively with a layer 13 of tungsten and a layer 16 of silicon. FIG. 1C shows the joining of the structures shown in FIGS. 1A and 1B, theses structures being brought into contact through their layers 15 and 16. After heat treatment from 650° C., the assembly shown in FIG. 1D is obtained. The SiC plate 10 is connected by an electrically conducting bonding to the SiC plate 12 thanks to the intermediate layer 14 formed between the two plates and comprising $WSi_2$.

Such an electrically conducting bonding can be used to bond a thin semi-conductor film onto a semi-conductor support. So as to obtain this thin film, the thickness of one of the two bonded plates may be reduced. This has two major disadvantages. On the one hand, it is difficult to obtain a thin film homogeneous throughout its thickness and, on the other hand, there is a loss from the rest of the semi-conductor plate supplying this film. This invention also enables one to remedy these disadvantages. A first solution makes use of a sacrificial layer. A second solution employs a cleavage method after ionic implantation.

Figure 2B:
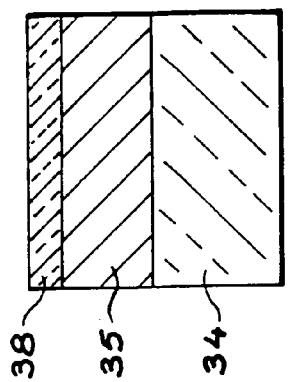
FIGS. 2A to 2E illustrate a second example of the creation of an electrically conducting bonding between two semi-conductor elements, according to the method of the invention.
Figure 2A:
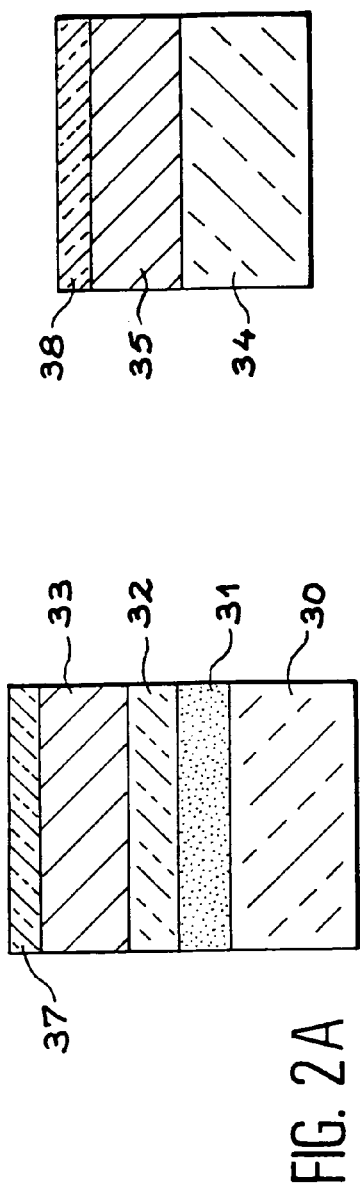
Figure 2E:
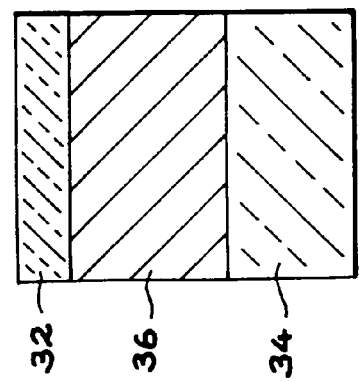
Figure 2D:
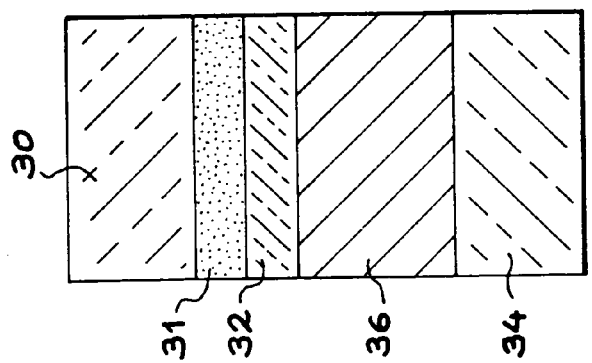
Figure 2C:
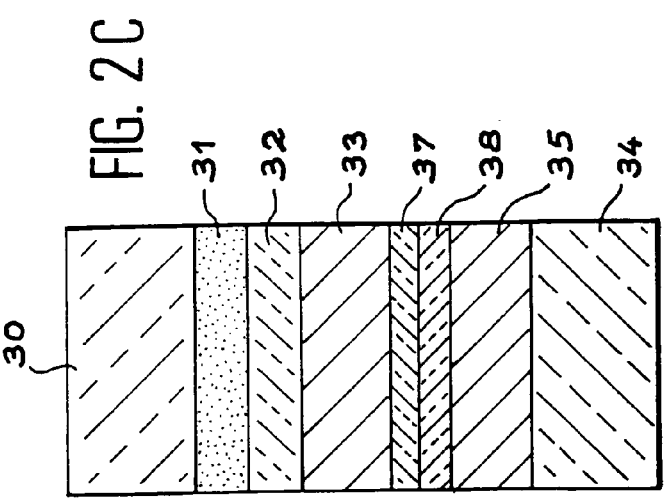

FIGS. 2A to 2E are transverse views which illustrate the creation of an electrically conducting bonding, in accordance with a kinetic approach, between a semi-conductive SiC plate and a thin SiC film obtained by dissolution of a sacrificial layer. FIG. 2A shows a silicon plate 30 covered with a layer 31 of silicon oxide or silicon nitride which will be used as a sacrificial layer. The sacrificial layer 31 is covered successively with a SiC layer 32, which will provide the thin film, a layer 33 of tungsten and a layer 37 of silicon. FIG. 2B shows a SiC plate 34 covered with a layer 35 of tungsten and a layer 38 of silicon. FIG. 2C shows the joining of the structures shown in FIGS. 2A and 2B, these structures being brought into contact through their layers 37 and 38. After heat treatment from 650° C., the assembly shown in FIG. 2D is obtained. The SiC layer 32 is connected through an electrically conducting bonding to the SiC plate 34 thanks to the intermediate layer 36 constituted by $WSi_2$. The sacrificial layer is then dissolved by a technique known to a man skilled in the art. On obtains, on the one hand, the structure shown in FIG. 2E, that is to say a thin film of SiC bonded through an electrical connection to a SiC support, and on the other hand, a reusable silicon plate.

Figure 3A:
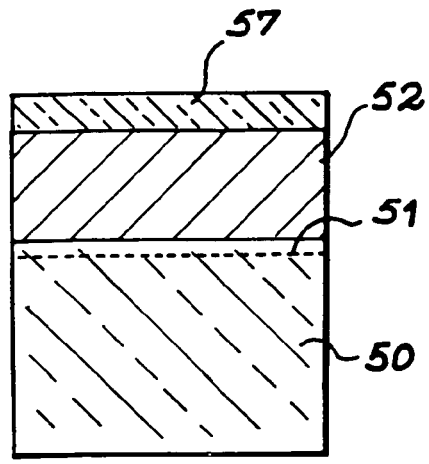
FIGS. 3A to 3D illustrate a third example of the creation of an electrically conducting bonding between two semi-conductor elements, according to the method of the invention.
Figure 3B:
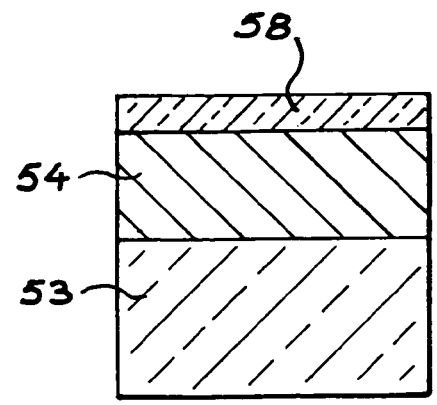
Figure 3C:
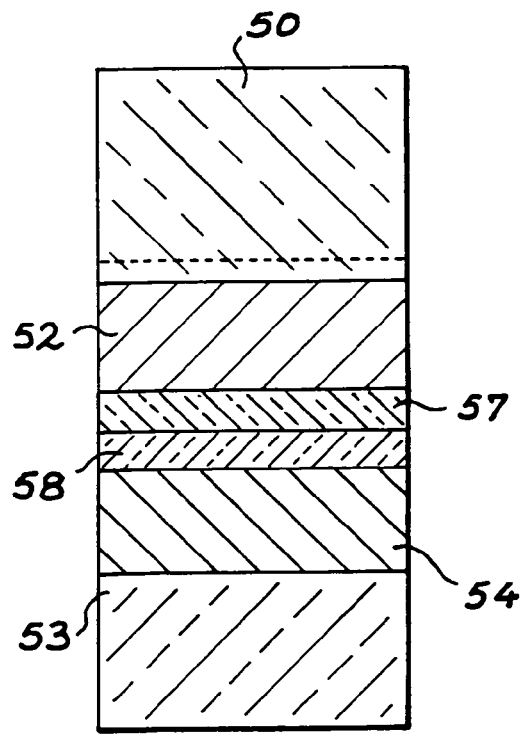
Figure 3D:
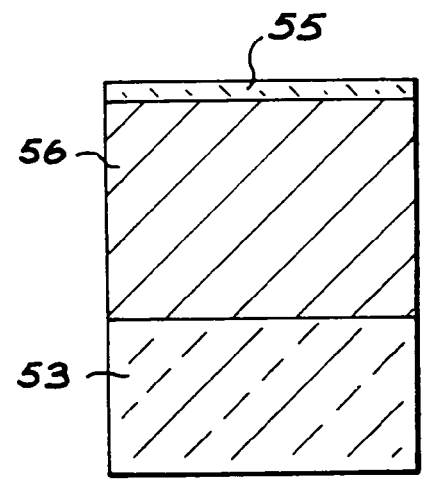

FIGS. 3A to 3D are transverse views which illustrate the creation of an electrically conducting bonding, in accordance with a kinetic approach, between a semi-conductive SiC plate and a thin SiC film obtained by cleavage after ionic implantation. FIG. 3A shows a SiC plate 50 within which a layer 51 of micro-cavities has been generated by ionic implantation, through one of the faces of the plate 50, in accordance with the technique disclosed by the document FR-A-2 681 472. A layer 52 of tungsten and a layer 57 of silicon have been successively deposited on the implanted face of the plate 50. FIG. 3B shows a plate 53 of SiC covered with a layer 54 of tungsten and a layer 58 of silicon. FIG. 3C shows the joining of the structures shown in FIGS. 3A and 3B, these structures being brought into contact through their layers 57 and 58. After heat treatment, the assembly shown in FIG. 3D is obtained. The heat treatment causes cleavage of the plate 50 along the layer of micro-cavities. A thin film 55 of SiC remains, which is connected by an electrically conducting bonding to the SiC plate 53 thanks to the intermediate layer 56 comprising $WSi_2$. The remainder of the plate 50 can then be reused.

In an advantageous way, so as to improve the bonding, pressure can be applied between the assembled structures. One may also, conjointly or not, use a thin layer of oxide on the surface of at least one of the structures in order to reduce the pressure necessary for the bonding, or indeed do without it. This layer of oxide must be sufficiently fine (a few Angstroms) and capable of interacting with at least one of the bonding materials to form, at the end of the process, precipitates which do not hinder the electrical conduction. During the heat treatment, the thin layer of oxide reacts with the metal which is offered to it, if the metal is sufficiently electropositive, to form metal oxides which are in the form of isolated precipitates. In particular, this is the case with titanium which reacts with the oxide $SiO_2$ to form $TiO_2$ and releasing silicon. Hence a stack $SiC/SiO_2$ (of thickness 0.01 μM)–$SiO_2$ (of thickness 0.01 μm)/Ti (of thickness 0.1 μm)/Si provides the structure $SiC/(TiSi_2+TiO_x)/Si$. The reaction occurs at 1000° C., implying reaction of the silicon with the titanium and reduction of the $SiO_2$ by the titanium, without the thin film of SiC being consumed. The $SiO_2$ must be thin so that the $TiO_2$ does not form a continuous layer. The system is stable up to 1330° C. (limited by the formation of a eutectic between $TiSi_2$ and Si at this temperature).

The description above can be applied to the bonding of other elements. Hence, for example, one may bond a layer of GaN epitaxiated on a substrate of sapphire or SiC with a SiC substrate by interposing at least two layers of materials, respectively W and Si.

The invention claimed is:

1. A method of creating an electrically conducting bonding between a face of a first semiconductor element and a face of a SiC film included in a second semiconductor element by heat treatment, comprising:

depositing at least one layer directly on the face of the first semiconductor element, each material chosen for each layer being either a semiconductor material or tungsten;

depositing at least one layer directly on the face of the SiC film, each material chosen for each layer being either a semiconductor material or tungsten, wherein at least one of the layers deposited on the first semiconductor element and on the SiC film is of tungsten;

applying the faces one against the other, with interposing of the deposited layers; and carrying out a heat treatment at a temperature of or greater than 650° C. for combining the deposited layers to form one layer that provides an electrically conducting bonding between the two faces, no insulator layer being interposed between the two faces such that the SiC film is not electrically insulated from the first semiconductor element;

wherein the at least one layer deposited onto the face of the first semiconductor element and the at least one layer deposited onto the face of the SiC film are chosen to react in a solid phase during the heat treatment and to form a temperature stable mixture with respect to the first and the second semiconductor elements, the heat treatment not inducing any reaction product between the deposited materials and the SiC film.

2. A method according to claim 1, wherein the first and second semiconductor elements are pressed one against the other during the heat treatment.

3. A method according to claim 1, wherein the first semiconductor element is SiC, the interposed layers comprising a layer of tungsten and a layer of silicon on the face of the first semiconductor element and a layer of tungsten and a layer of silicon on the face of the second semiconductor element, the mixture formed after the heat treatment comprising $WSi_2$.

4. A method according to claim 1, further comprising a preliminary defining of the SiC film as a superficial layer of the second semiconductor element so as to be detachable therefrom.

5. A method according to claim 4, wherein the preliminary defining comprises a forming of the second semiconductor element by stacking a support, a sacrificial layer, and the SiC film, detachment of the SiC film from the rest of the substrate being obtained after creation of the bonding, by dissolution of the sacrificial layer.

6. A method according to claim 4, wherein the preliminary defining comprises an ionic implantation through the face of the second semiconductor element for forming microcavities within so as to define the SiC film between the microcavities and the implanted face of the second semiconductor element, detachment of the SiC film from the rest of the second semiconductor element being consecutive to the bonding heat treatment or to a specific heat treatment or to the application of mechanical forces or to the combination of a heat treatment and the application of mechanical forces.

7. A method of creating an electrically conducting bonding between a face of a first semiconductor element and a face of a second semiconductor element by heat treatment, at least one of the faces of the first and the second elements to be bonded being of SiC, the method comprising:

depositing at least one layer directly on the face of the first semiconductor element, each material chosen for each layer being either a semiconductor material or tungsten;

depositing at least one layer directly on the face of the second semiconductor element, each material chosen for each layer being either a semiconductor material or tungsten, wherein at least one layer deposited on the first and second semiconductor elements being of tungsten;

applying the faces one against the other, with interposing of the layers of deposited material; and carrying out a heat treatment at a temperature of or greater than 650° C. for combining the deposited layers to form one layer that provides an electrically conducting bonding between the two faces, no insulator layer being interposed between the two faces such that the second semiconductor element is not electrically insulated from the first semiconductor element;

wherein the at least one layer deposited onto the face of the first semiconductor element and the at least one layer deposited onto the face of the second semiconductor element are chosen to react in a solid phase during the heat treatment and to form a temperature stable mixture with respect to the first and the second semiconductor elements, the heat treatment not inducing any reaction product between the deposited materials and at least one of the semiconductor elements, and wherein one of the layers is deposited with an excess thickness such that a part of this layer, in contact with another of the deposited layers, combines with the another deposited layer to form the stable mixture, the another layer deposited with an excess thickness, in contact with the semiconductor element on which it is deposited, reacting during the heat treatment with the semiconductor element to form a film with ohmic contact.

8. A method according to claim 7, wherein the first semiconductor element is SiC and the second semiconductor element is SiC, the interposed layers comprising a layer of tungsten and a layer of silicon on said face of the first semiconductor element and a layer of tungsten and a layer of silicon on the face of the second semiconductor element, the ratio of total thickness of the Si layers to total thickness of the W layers is below 2.5, the mixture formed after the heat treatment comprising $WSi_2$.

9. A method of creating an electrically conducting bonding between a face of a first semiconductor element and a face of a SiC film included in a second semiconductor element by heat treatment, comprising:

depositing at least one layer directly on the face of the first semiconductor element, each material chosen for each conductive layer being either a semiconductor material or a tungsten;

depositing at least one layer directly on the face of the SiC film, each material chosen for each layer being either a semiconductor material or tungsten, wherein at least one layer deposited on the first semiconductor element or on the SiC film being of tungsten;

forming at least one thin oxide layer onto at least one of the deposited layers with a thickness of a few angstroms;

applying the two faces one against the other, with interposing of the layers of deposited material and the at least one thin oxide layer; and carrying out a heat treatment at a temperature of or greater than 650° C. for combining the deposited layers to form one layer that provides an electrically conducting bonding between the two faces, wherein the at least one thin oxide layer is interposed between the two faces;

wherein the at least two layers deposited onto the faces of the first and second semiconductor elements are chosen to react in a solid phase during the heat treatment and to form a temperature stable mixture with respect to the first and the second semiconductor elements, the heat treatment not inducing any reaction product between the deposited materials and at least one of the semiconductor elements, and the oxide of the at least one thin oxide layer is chosen to react with at least one material of the layers, and wherein the thickness of the at least one thin oxide layer and the thickness of the layer with which the oxide reacts are chosen such that the oxide formed is in a form of isolated precipitates that do not substantially harm the electrically conducting bonding.

* * * * *